(12) United States Patent
Yu et al.

(10) Patent No.: US 8,932,962 B2
(45) Date of Patent: Jan. 13, 2015

(54) CHEMICAL DISPENSING SYSTEM AND METHOD

(75) Inventors: Weibo Yu, Singapore (SG); Kuo Bin Huang, Jhubei (TW); Chao-Cheng Chen, Shin-Chu (TW); Syun-Ming Jang, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 147 days.

(21) Appl. No.: 13/442,040

(22) Filed: Apr. 9, 2012

(65) Prior Publication Data

US 2013/0267099 A1  Oct. 10, 2013

(51) Int. Cl.
*H01L 21/302* (2006.01)

(52) U.S. Cl.
USPC ............. 438/748; 438/745; 438/747; 216/92

(58) Field of Classification Search
USPC ............. 438/745, 748, 749, 750, 747; 156/345.11, 345.12, 345.17, 345.21, 156/345.22, 345.24, 345.27, 345.13; 216/90, 91, 92

See application file for complete search history.

(56) References Cited

U.S. PATENT DOCUMENTS

| 5,580,607 | A | 12/1996 | Takekuma et al. |
| 6,793,764 | B1 | 9/2004 | Doan |
| 7,470,344 | B1 | 12/2008 | Doan |
| 2006/0193969 | A1 | 8/2006 | Prentice et al. |
| 2008/0118629 | A1* | 5/2008 | Shimoda et al. ............. 427/8 |
| 2008/0220340 | A1* | 9/2008 | Kulp et al. ............. 430/4 |
| 2011/0127236 | A1* | 6/2011 | Yamamoto et al. ............. 216/83 |

* cited by examiner

*Primary Examiner* — Lan Vinh
(74) *Attorney, Agent, or Firm* — Duane Morris LLP (57) ABSTRACT

A method and apparatus for dispensing a liquid etchant onto a wafer dispenses the liquid etchant onto a wafer using a scanning dispensing nozzle while controlling the dispensing temperature of the etchant in real time as a function of the radial position of the dispensing nozzle over the wafer. The dispensing temperature of the etchant is controlled to enhance the effectiveness of the etchant and thus compensate for the lower etching rate zones in the wafer.

10 Claims, 8 Drawing Sheets

CHEMICAL DISPENSING SYSTEM AND METHOD

FIELD

The disclosed subject matter generally relates to a chemical dispensing apparatus and method for semiconductor wafer processing and more particularly to semiconductor wafer surface etching.

BACKGROUND

Wet chemical etching is widely used for fabrication of semiconductor wafers. And, wet etchings in single wafer processing tool are dominant for advanced technology nodes compared wet etching in batch processing tool. Typically, the wafer is mounted on a rotating wafer-receiving surface and a liquid etchant is applied to the wafer through a nozzle positioned above the wafer. The nozzle can be at a fixed position over one location such as the rotational center of the wafer-receiving surface, and thus the center of the wafer, or the nozzle can be a scanning nozzle that scans between the rotational center and the peripheral edge of the wafer-receiving surface. As the wafer is rotated by the wafer-receiving surface, centrifugal force distributes the liquid etchant along the surface of the wafer.

The wafer-receiving surface is heated to promote the etching action on the wafer. However, the temperature of the wafer-receiving surface is not uniform across the surface. Because of the heat loss to the ambient along the peripheral edge of the wafer-receiving surface, there is a temperature gradient in radial direction with the temperature decreasing from the central region to the peripheral edge. This results in non-uniform etching of the wafer because the chemical etch rate or effectiveness is dependent on the temperature and the etch rate decreases with lower temperature for most of cases.

BRIEF DESCRIPTION OF THE DRAWINGS

All drawings are schematic and are not to scale.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 1A:
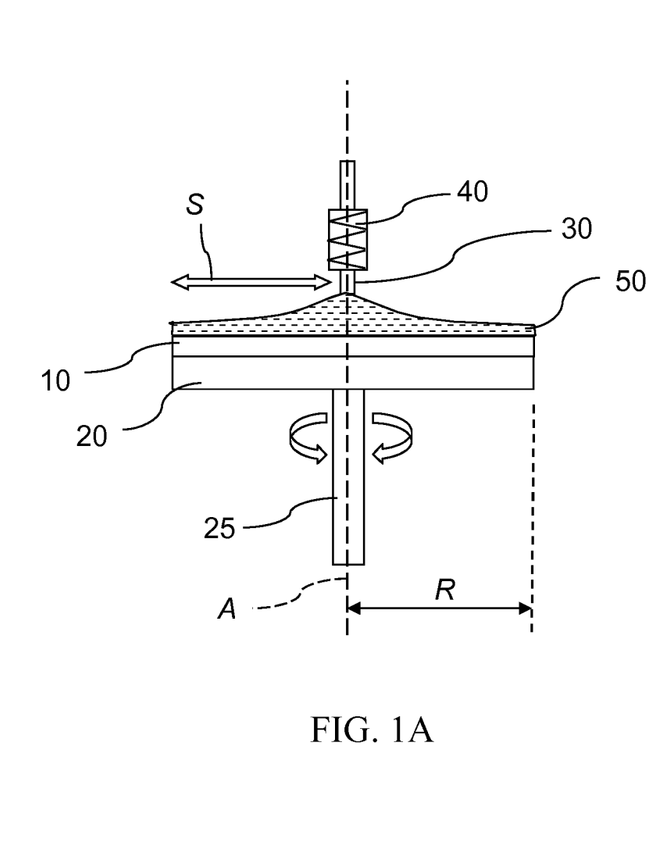
FIGS. 1A and 1B show partial side views of an apparatus for dispensing a liquid according to an embodiment.
Figure 1B:
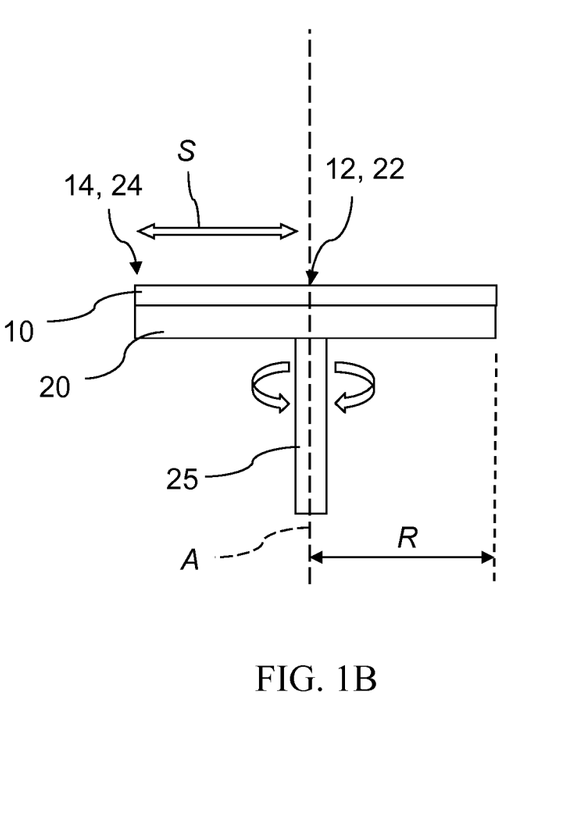

According to an embodiment, FIGS. 1A and 1B show partial side views of a liquid chemical dispensing apparatus for dispensing a liquid 50, such as an etchant, onto a semiconductor wafer 10 is disclosed. The apparatus is configured to control the temperature of the dispensing liquid 50 in real time basis while dispensing in order to compensate for the temperature gradient on the wafer surface. The apparatus is suitable for dispensing a liquid such as an etchant onto a wafer surface. The apparatus comprises a wafer-receiving surface 20, such as a spin chuck. The wafer-receiving surface 20 is rotatable about an axis A and the axis A defines a rotational center 22 of the wafer-receiving surface 20. The apparatus has a scanning dispensing nozzle 30 positioned over the wafer-receiving surface 20.

When in use, a wafer 10 is mounted on the wafer-receiving surface 20 as shown. The wafer 10 is mounted on the wafer-receiving surface 20 so that the wafer's geometric center 12 is aligned with the rotational center 22 of the wafer-receiving surface 20. Thus, the geometric center 12 of the wafer is also its rotational center when the wafer-receiving surface 20 spins about the axis A. The dispensing nozzle 30 is positioned over the wafer 10 at a distance from the wafer surface. Generally, the wafer-receiving surface 20 is adapted to accommodate wafers of various size in diameter and therefore the wafer-receiving surface 20 does not have the same diameter as the wafer 10. The radius of the wafer 10 is identified as R in FIG. 1A.

The dispensing nozzle 30 is configured to scan, i.e., move, over the wafer 10 between the wafer's rotational center 12 and peripheral edge 14. When dispensing the liquid etchant 50, the scanning motion of the dispensing nozzle 30 promotes more uniform dispensing. Generally, the apparatus is configured so that the scanning motion of the dispensing nozzle 30 can be a single pass from the wafer's rotational center 12 to the peripheral edge 14 or a multiple pass back and forth during a dispensing cycle. The range of the dispensing nozzle's scanning motion is illustrated by the arrow S.

According to an embodiment, a nozzle heater 40 is provided on the dispensing nozzle 30 for heating the dispensing liquid 50 to a desired dispensing temperature at the dispensing nozzle 30 during the dispensing process and also change the dispensing temperature quickly in real time as the dispensing nozzle 30 is scanning during the dispensing process. As used herein, "dispensing temperature" refers to the temperature of the dispensing liquid 50 at the nozzle 30 as the liquid is being dispensed. The nozzle heater 40 has a high resolution and fast response time sufficient to control the dispensing temperature of the liquid 50 to a desired temperature profile over the radius R of the wafer 10 in real time as the dispensing nozzle 30 scans during a dispensing process cycle. An example of the nozzle heater 40 is an infrared heater.

Figure 1C:
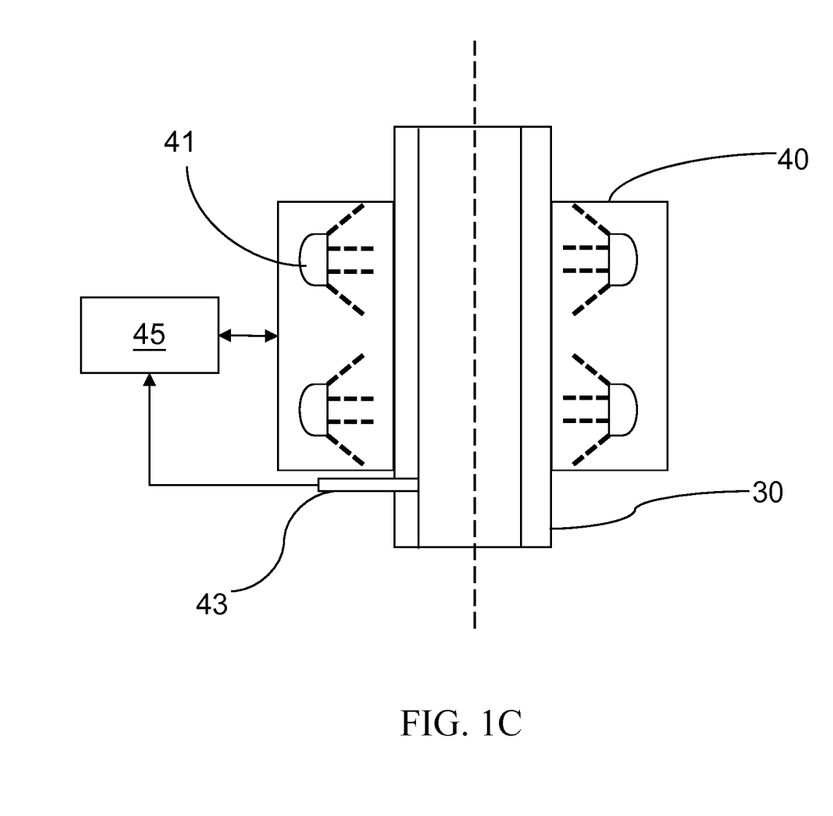
FIG. 1C shows the structural details of the dispensing nozzle and the nozzle heater assembly according to an embodiment.

FIG. 1C shows a cross section of an example of the nozzle heater 40. The liquid chemical dispensing apparatus of the present disclosure includes a controller 45 for controlling the nozzle heater 40 and the scanning motion of the dispensing nozzle 30. In this example, the nozzle heater 40 is an infrared heater with real-time close looped control system wrapping or surrounding the dispensing nozzle 30. The nozzle heater 40 surrounds the dispensing nozzle 30 to provide even heating. The nozzle heater 40 can be comprised of multiple heating elements. In this example, the heater 40 comprises a plurality of infrared lamps 41 as the heating elements, temperature sensor 43 for monitoring the temperature of the liquid 50 heated by the nozzle heater 40 flowing through the nozzle 30. The temperature sensor 43 is provided downstream from the heating elements so that the sensor measures the temperature of the liquid after it is heated by the heating elements. The temperature sensor 43 enables the controller 45 to monitor the temperature of the liquid 50 on a real-time basis and allows the controller 45 to accurately control the temperature of the liquid to a desired temperature.

According to an embodiment, the nozzle heater 40 is capable of controlling the dispensing temperature of the liquid 50 to within ±10° C. range or tighter range. The response time of the heater 40 is desired to be fast, e.g. <1° C./sec. The particular desired temperature to which the liquid 50 is heated by the nozzle heater 40 and the tolerance range for that desired temperature will depend on the sensitivity of the etching rate vs. temperature profile of the particular etchant being used. For example, the tolerance range can be smaller for more sensitive etching process and vice versa. The response time required for the nozzle heater 40 also depends on the sensitivity of the etching rate vs. temperature profile of the particular etchant. For example, a faster response time would be desired for an etchant with more sensitive etching rate vs. temperature profile.

Figure 2:
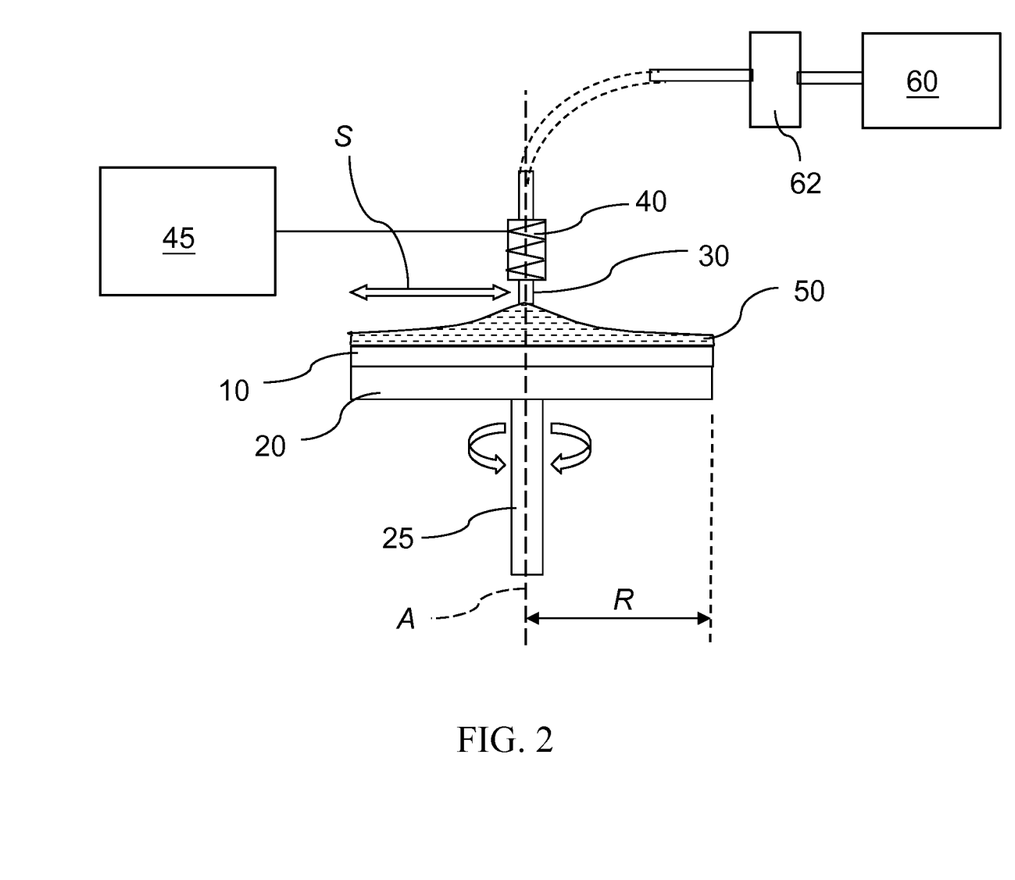
FIG. 2 is another illustration of the apparatus of FIGS. 1A and 1B including a controller according to an embodiment.

Referring to FIG. 2, the controller 45 is configured with appropriate control circuits, data processors, data storage, etc., to control the heat output of the heater 40, and in turn the dispensing temperature of the liquid 50, as well as controlling the scanning motion of the dispensing nozzle 30. The controller 45 is configured to coordinate the scanning movement of the dispensing nozzle 30 and the heater 40 and can produce a desired temperature profile of the dispensing temperature of the liquid as a function of the dispensing nozzle's radial position. The dispensing nozzle's "radial position" refers to the position of the dispensing nozzle along the radius R of the wafer 10. Therefore, the controller 45 controls the dispensing temperature to be at a particular desired temperature as a function of the dispensing nozzle's radial position along the radius R so that a desired temperature profile of the dispensing temperature is obtained.

The liquid chemical dispensing apparatus includes a reservoir or a source supply 60 for the liquid that is remotely located from the dispensing nozzle 30. The dispensing apparatus also generally includes a main heater 62 for preheating the liquid to a temperature as the liquid is supplied to the dispensing nozzle 30.

Such novel apparatus can be applied for wet etching of semiconductor wafers to substantially improve the etching uniformity in such processes. The apparatus can be utilized in wet etching of silicon oxide wafers using HF solution, wet etching of silicon nitride wafers using $H_3PO_4$ solution, and wet etching of silicon wafers by $NH_4OH$ or $(CH_3)_4NOH$, for example.

The ability of the liquid chemical dispensing apparatus of the present disclosure to control the temperature profile of the dispensing liquid as a function of the wafer's radius R, can be used to effectively compensate for the non-uniform etching rate over the wafer's radius R often encountered in existing wet etching processes.

In the existing wet etching processes, the etching rate of the liquid etchant is generally not uniform over the wafer and tends to diminish away from the center of the wafer because the dispensed liquid etchant often tends to be thinner away from the center of the wafer due to the wafer being rotated. This non-uniformity in etching rate is often exacerbated by the undesirably lower temperature of the liquid etchant observed away from the center of the wafer. The etching performance of the liquid etchants are optimal at some elevated temperature above the ambient temperature of the semiconductor manufacturing environment. Thus, the liquid etchants are usually heated to a temperature above the ambient temperature before being dispensed onto the wafer being etched. But as the liquid etchant spreads out on the spinning wafer surface, the temperature of the liquid drops due to heat loss to the wafer. The heat loss to the wafer tends to be greater closer to the periphery of the wafer because of the increased surface area. Using the liquid chemical dispensing apparatus of the present disclosure, the non-uniform temperature profile of the liquid etchant over the wafer can be compensated and improve the etch rate uniformity.

Figure 3:
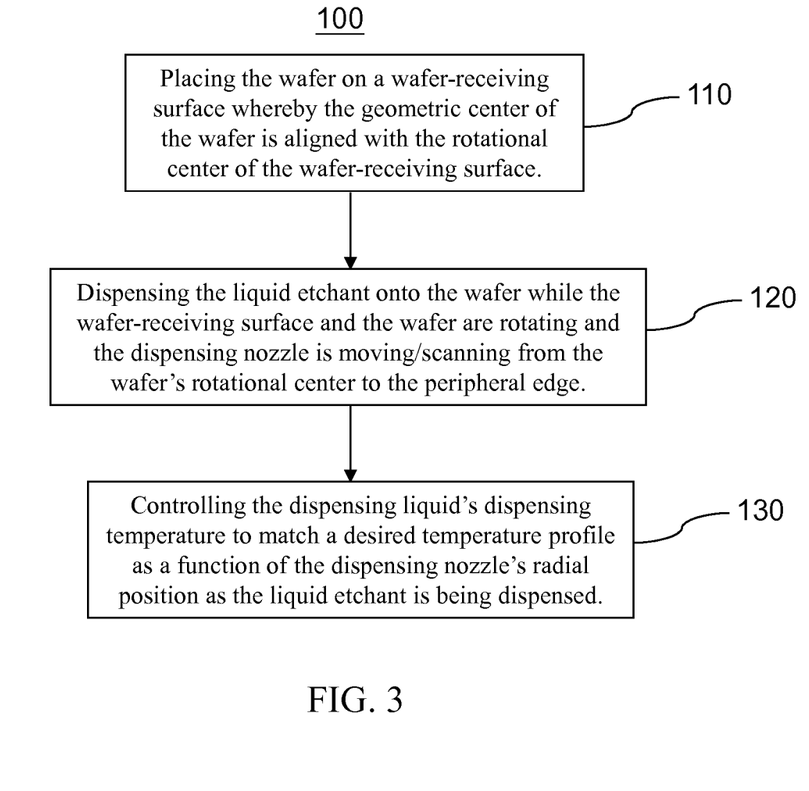
FIG. 3 is a flowchart illustrating a method of dispensing a liquid chemical such as a liquid etchant onto a semiconductor wafer according to an embodiment.

Referring to the flowchart 100 shown in FIG. 3, a method of dispensing a liquid chemical such as a liquid etchant onto a semiconductor wafer is disclosed. The method comprises placing the wafer on a wafer-receiving surface whereby the geometric center of the wafer is aligned with the rotational center of the wafer-receiving surface, where the wafer has a radius and a peripheral edge. (see Box 110). As described above, the wafer-receiving surface is rotatable about the axis A and has a rotational center defined by the axis. Next, the liquid etchant is dispensed onto the wafer surface using a scanning dispensing nozzle positioned over the wafer while the wafer-receiving surface and the wafer are rotating about the axis and the dispensing nozzle is moving from the wafer's rotational center to the peripheral edge. (See box 120). As the liquid etchant is being dispensed, the dispensing liquid's temperature is controlled to match a desired temperature profile as a function of the dispensing nozzle's radial position. (See box 130).

Figure 4A:
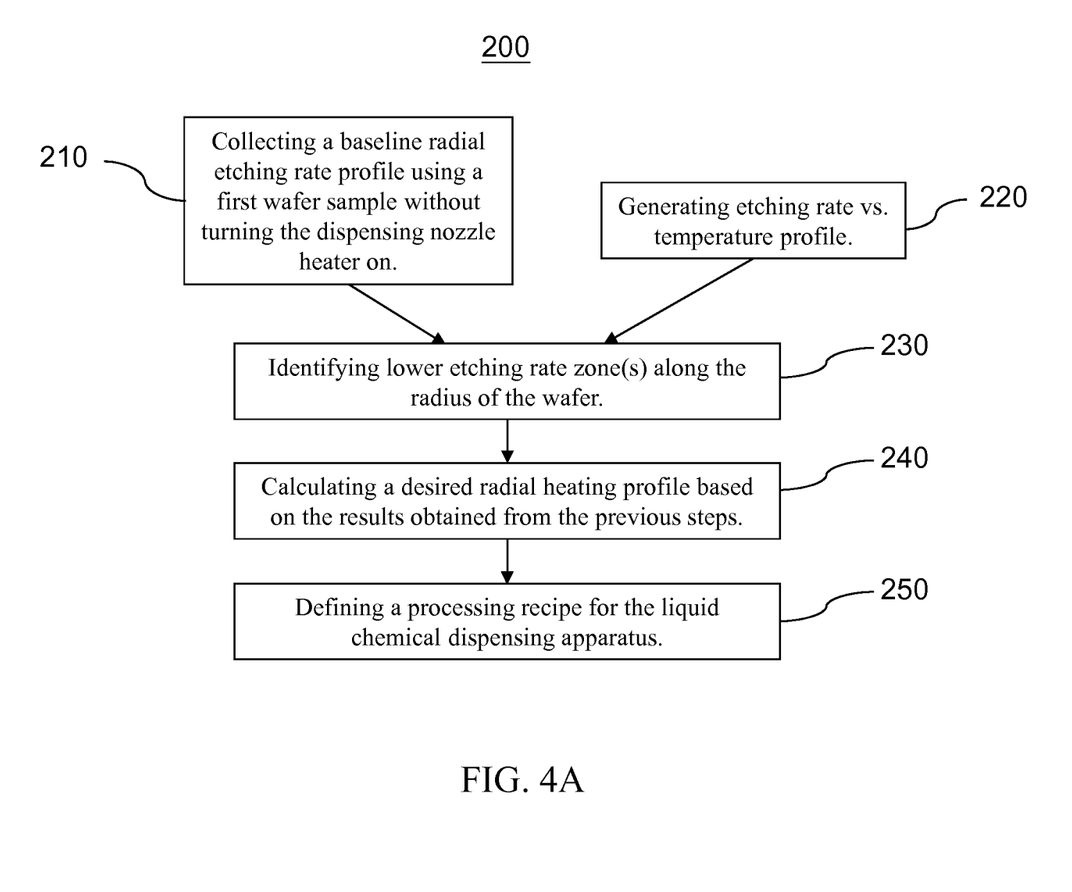
FIGS. 4A and 4B are flowcharts illustrating a method of initializing the apparatus of the present disclosure according to an embodiment.

According to yet another embodiment, a method of initializing the apparatus for dispensing a liquid etchant onto a wafer described above is disclosed in conjunction with the flowchart 200 shown in FIG. 4A. The method comprises collecting a baseline radial etching rate profile for the etchant at a baseline target temperature T1 (shown in FIG. 6) using a first wafer sample without turning the dispensing nozzle heater on. (See box 210). This step would include etching the first wafer sample using the dispensing apparatus by dispensing the liquid etchant onto the first wafer sample with the dispensing nozzle heater turned off and measuring the amount of the wafer material etched by conducting a physical analysis of the first wafer sample. Because the nozzle heater 40 is not on, the etchant is maintained at the baseline temperature T1 using the main heater 62.

Figure 6:
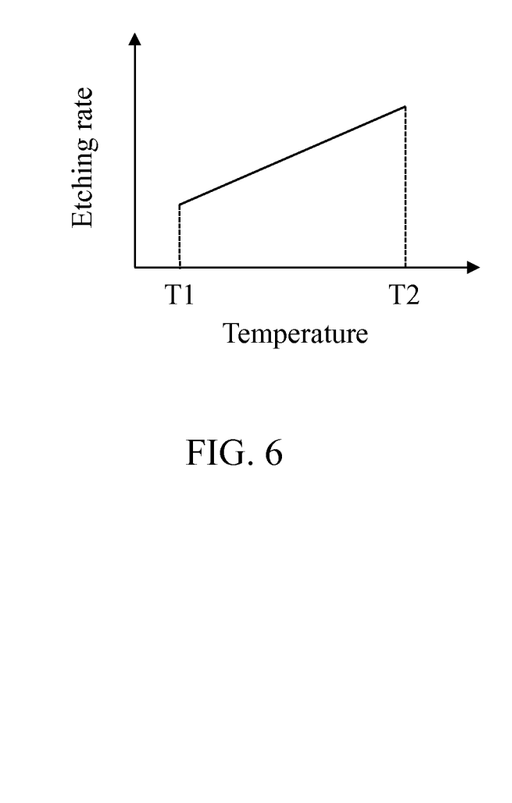
FIG. 6 shows an example of an etching rate vs. temperature plot.

Etching rate vs. temperature profile of the particular etchant is generated by collecting data on the dependence of the etching rate over a range of temperatures between T1 and T2, where T2 is higher than T1. (See box 220). This step would include etching wafer samples by dispensing the liquid etchant at a plurality of different temperatures from T1 to T2, each wafer sample being etched at different temperatures, and measuring the corresponding etching rates. The plurality of temperatures are higher than T1. At a minimum, this additional etching rate profile data is generated at the two temperature points T1 and T2. An example of the resulting etching rate vs. temperature profile is shown in FIG. 6. Again, to collect this data, the liquid etchant is heated using the main heater 62 only without the use of the nozzle heater 40. The amount of the wafer material etched is measured by conducting a physical analysis of all etched wafer samples. Such etching rate vs. temperature profile is used to determine the optimal temperature for the dispensing liquid etchant that would enhance the etching rate in the lower etching rate zones that are identified in the subsequent steps described below.

The method steps described in the boxes 210 and 220 do not have to be performed in that sequential order. The two steps can be performed simultaneously or in any order desired or convenient.

Figure 5A:
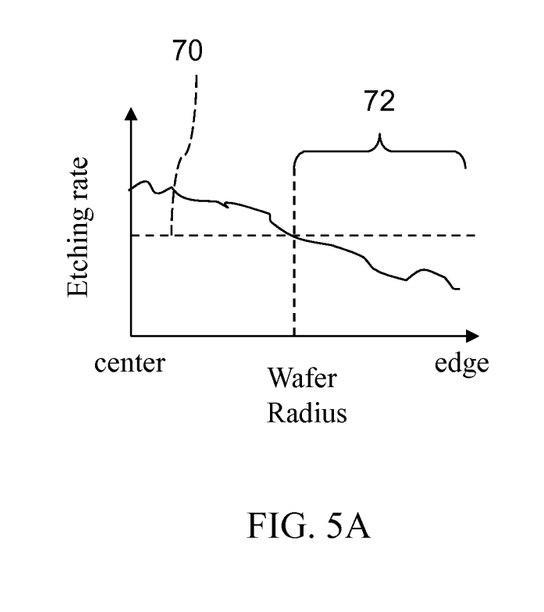
FIGS. 5A-5C show examples of radial etching rate profiles according to the present disclosure.
Figure 5B:
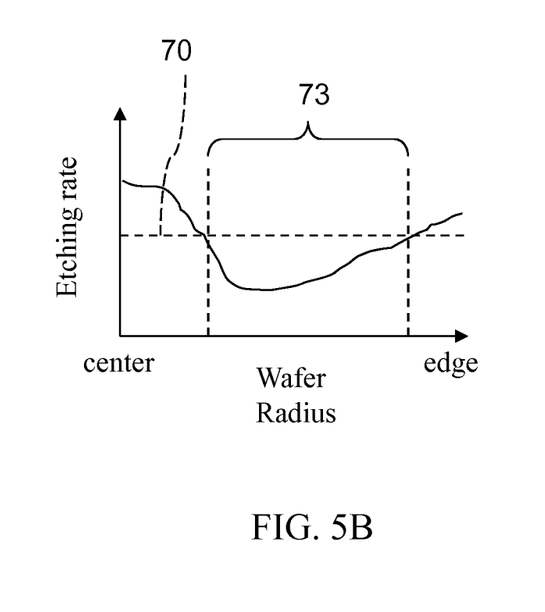
Figure 5C:
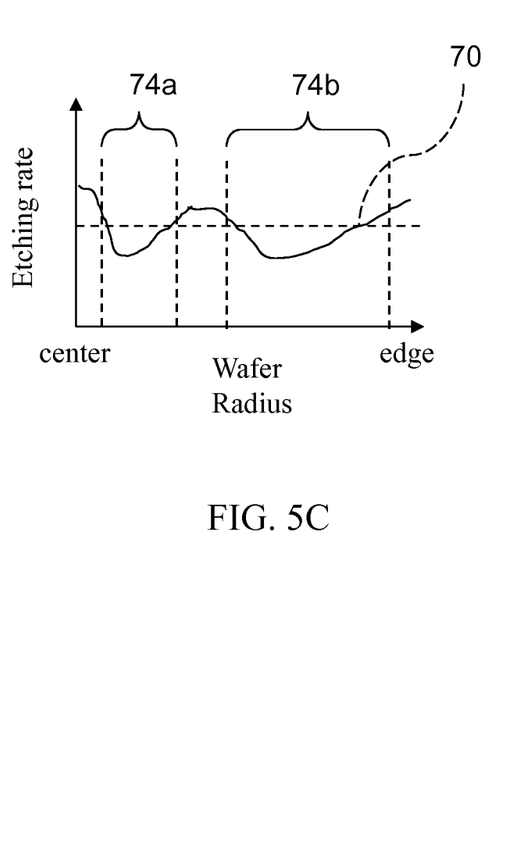

Using the baseline radial etching rate profile data, lower etching rate zones are identified along the radius of the wafer. (See box 230). FIGS. 5A-5C show examples of radial etching rate profile. The figures show qualitatively, what such radial etching rate profiles might look like. The profiles are plots of etching rate as a function of the radial distance on the wafer from the center to the peripheral edge. The etching rate profile data readily identifies the lower etching rate zone(s) along the wafer's radius in which the measured etching rate is below some predetermined threshold etching rate 70. The identified lower etching rate zones are where the apparatus of the present disclosure can be used to enhance the etching rate by appropriately increasing the temperature of the liquid etchant 50 at the dispensing nozzle using the nozzle heater 40 as the etchant is being dispensed. There can be one or more lower rate zones.

In the example shown in FIG. 5A, the lower etching rate zone 72 starts somewhere between the center of the wafer and extends to the wafer's peripheral edge. However, the lower etching rate zone could be anywhere along the radius of the wafer. For example, in the example shown in FIG. 5B of another etchant dispensing system, the lower etching rate zone 73 is in a region between the center of the wafer and the edge of the wafer without extending to the wafer edge. In another embodiment, there could be more than one lower etching rate zones 74a and 74b as shown in FIG. 5C.

Next, based on the lower etching rate zone information, the etching rate vs. temperature profile and dispensing nozzle scan rate, a desired radial heating profile for the nozzle heater 40 is calculated. (See box 240). The desired radial heating profile is a template that tells the nozzle heater controller 45 when and how much to power on the nozzle heater 40 to obtain the desired temperature for the dispending liquid etchant 50 that would enhance the etching rate in the lower etching rate zones. The nozzle heater controller 45 controls the electrical power supplied to the nozzle heater 40 and the scanning movement of the dispensing nozzle 30 so that as the dispensing nozzle 30 is scanning through the one or more lower etching rate zones along a wafer's radius R, the dispensing liquid etchant is heated to a desired temperature following the desired radial heating profile. This increases the etching rate in the lower etching rate zones 72, 73, 74a, 74b up to at least the threshold etching rate 70.

Next, an appropriate processing recipe for the liquid chemical dispensing apparatus for etching wafers is defined. (See box 250). The processing recipe comprises the process parameters used by the controller 45. Once the apparatus for dispensing a liquid etchant onto a wafer is initialized through the process described above, wafers can be processed through the etching process using the processing recipe.

Figure 4B:
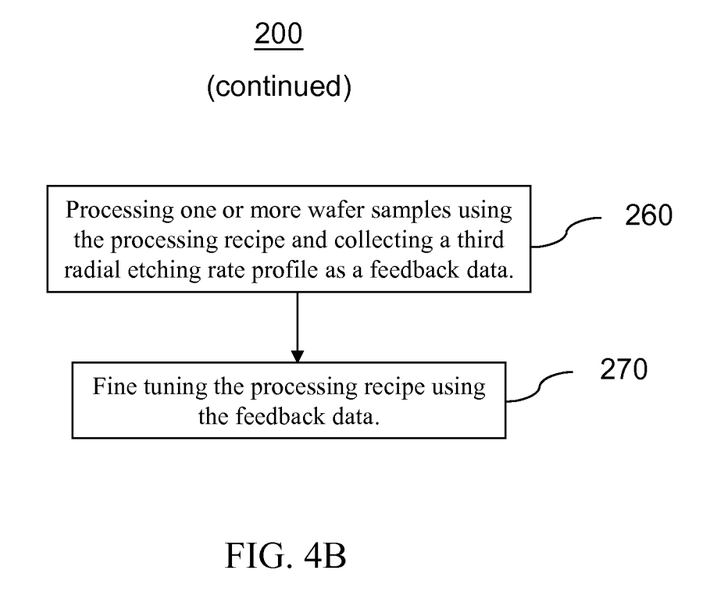

Referring to FIG. 4B, according to another embodiment, the method of initializing the apparatus can further include optionally processing one or more additional wafer samples using the processing recipe and collecting a second radial etching rate profile as a feedback data. (See box 260). Then, the feedback data is used for fine tuning the processing recipe. (See box 270). For example, depending on the second radial etching rate profile in the feedback data, the scanning rate can be adjusted or the desired radial heating profile can be adjusted to further optimize enhancing the etching rate in the lower etching rate zones 72, 73, 74a, 74b. According to another embodiment, the steps described in the boxes 260 and 270 can be repeated as necessary in order to further fine tune the processing recipe.

Although the subject matter has been described in terms of exemplary embodiments, it is not limited thereto. Rather, the appended claims should be construed broadly, to include other variants and embodiments, which may be made by those skilled in the art.

What is claimed is:

1. A method for dispensing a liquid onto a wafer having a geometric center and a peripheral edge, the method comprising:
    placing the wafer on a wafer-receiving surface, the wafer-receiving surface being rotatable about an axis and having a rotational center defined by the axis, whereby the wafer's geometric center is aligned with the rotational center of the wafer-receiving surface;
    dispensing the liquid onto the wafer using a scanning dispensing nozzle positioned over the wafer while the wafer-receiving surface and the wafer are rotating about the axis and the dispensing nozzle is moving from the rotational center to the peripheral edge of the wafer; and
    controlling the dispensing liquid's dispensing temperature as a function of the dispensing nozzle's radial position between the rotational center and the peripheral edge of the wafer, while the liquid is being dispensed.

2. The method of claim 1, wherein controlling the dispensing liquid's dispensing temperature comprises heating the liquid using a nozzle heater provided about the nozzle to a temperature as a function of the dispensing nozzle's radial position between the rotational center and the peripheral edge of the wafer.

3. A method for initializing an apparatus for dispensing a liquid etchant onto a wafer, the apparatus comprising a wafer-receiving surface rotatable about an axis, the wafer-receiving surface having a rotational center defined by the axis and configured for having the wafer mounted thereon, the wafer having a rotational center and a peripheral edge and whereby the rotational center aligns with the rotational center of the wafer-receiving surface when mounted on the wafer-receiving surface; a dispensing nozzle positioned over the wafer-receiving surface, the dispensing nozzle being configured to move between the rotational center and the peripheral edge of the wafer; a nozzle heater provided on the dispensing nozzle for heating the liquid being dispensed to a dispensing temperature; a main heater for preheating the liquid before the liquid reaches the dispensing nozzle; and a controller configured for controlling the heater and the scanning dispensing nozzle's movement, the method comprising:
    (a) collecting a baseline radial etching rate profile by etching a first wafer sample by dispensing the liquid etchant onto the first wafer sample without turning the heater on, wherein the liquid etchant is at a baseline temperature;
    (b) generating an etching rate vs. temperature profile of the liquid etchant;
    (c) identifying one or more lower etching rate zones along the radius of the wafer;
    (d) calculating a desired radial heating profile; and
    (e) defining a processing recipe for the liquid chemical dispensing apparatus that incorporates the desired radial heating profile.

4. The method of claim 3, wherein in step (a), the baseline temperature is maintained by the main heater.

5. The method of claim 3, wherein the step (a) comprises measuring the amount of wafer material etched from the first wafer sample by conducting a physical analysis of the first wafer sample.

6. The method of claim 3, wherein the step (b) comprises etching additional wafer samples at a plurality of different temperatures using the liquid dispensing apparatus, wherein the plurality of different temperatures are higher than the baseline temperature.

7. The method of claim 3, wherein the step (b) comprises measuring the amount of wafer material etched from the first wafer sample by conducting a physical analysis of the first wafer sample.

8. The method of claim 3, wherein the step (c) is conducted using the baseline radial etching rate profile.

9. The method of claim 3, further comprising the steps of
(f) processing one or more additional wafer samples using the processing recipe and collecting a second radial etching rate profile as a feedback data; and
(g) fine tuning the processing recipe using the feedback data.

10. The method of claim 9, further comprising repeating the steps (f) and (g) in order to further fine tune the processing recipe.

* * * * *